United States Patent [19]

Kondoh

[11] Patent Number: 5,530,380

[45] Date of Patent: Jun. 25, 1996

[54] DECODER CIRCUIT WHICH RESISTS A FLUCTUATION OF A POWER SUPPLY

[75] Inventor: Chiaki Kondoh, Tokyo, Japan

[73] Assignee: NEC Corporation, Tokyo, Japan

[21] Appl. No.: 354,150

[22] Filed: Dec. 6, 1994

[30] Foreign Application Priority Data

Dec. 28, 1993 [JP] Japan .................................. 5-335189

[51] Int. Cl.$^6$ ...................... H03K 19/003; H03K 19/096
[52] U.S. Cl. ................................ 326/98; 326/33; 326/105
[58] Field of Search ............................... 326/33, 105, 88, 326/97.98

[56] References Cited

U.S. PATENT DOCUMENTS

| | | | |
|---|---|---|---|
| 4,345,170 | 8/1982 | Sampson, III | 326/98 |
| 4,780,626 | 10/1988 | Guerin et al. | 326/98 |
| 4,797,580 | 1/1989 | Sunter | 326/33 |
| 4,827,160 | 5/1989 | Okano | 326/97 |
| 4,849,658 | 7/1989 | Iwamura et al. | 326/98 |
| 5,144,163 | 9/1992 | Matsuzawa et al. | 326/98 |
| 5,146,115 | 9/1992 | Benhamida | 326/106 |

FOREIGN PATENT DOCUMENTS

| | | |
|---|---|---|
| 0283228A2 | 9/1988 | European Pat. Off. . |
| 8200741A1 | 3/1982 | WIPO . |
| WO8504539A1 | 10/1985 | WIPO . |

OTHER PUBLICATIONS

Pretorious et al. "Charge Redistribution and Noise Margins in Domino CMOS Logic" *IEEE Transactions on Circuits and Systems* vol. CAS–33, No. 8, Aug. 1986, pp. 786–793.

Wang et al. "Novel Dynamic CMOS Logic Free From Problems of Charge Sharing and Clock Skew" *International Journal of Electronics* vol. 66, No. 5, May 1989, pp. 679–695.

*Primary Examiner*—Edward P. Westin
*Assistant Examiner*—Richard Roseen
*Attorney, Agent, or Firm*—Whitham, Curtis, Whitham & McGinn

[57] ABSTRACT

A decoder circuit includes p-channel MOS transistors $P_1$ and $P_2$, n-channel MOS transistors $N_1$ to $N_4$ having gates to which data signals $D_1$ to $D_4$ are inputted, respectively, an n-channel MOS transistor $N_s$ connected in series to the n-channel MOS transistors $N_1$ to $N_4$ and having a gate to which the precharging signal $\Phi$ is inputted, and an n-channel MOS transistor $N_5$ connected between $P_2$ and $N_1$. In the decoder circuit, the gate of $N_5$ is connected to the drain of $P_2$, and a capacity $C_H$ is connected between the gate of $N_5$ and a power potential. In a holding state, the power potential is held by the aid of the capacity $C_H$ connected to the gate of $N_5$.

5 Claims, 7 Drawing Sheets

DECODER CIRCUIT WHICH RESISTS A FLUCTUATION OF A POWER SUPPLY

BACKGROUND OF THE INVENTION

1. Field of the Invention

The present invention relates to a decoder circuit, and more particularly to a dynamic decoder which resists a noise from a power supply.

2. Description of the Related Art

A conventional dynamic decoder circuit, for example, having four input terminals is constituted as shown in FIG. 4. That is, the circuit includes a p-channel MOS transistor $P_1$ having a source connected to a power supply VDD and a gate to which a precharging signal $\Phi$ is supplied through a buffer 1, and an n-channel MOS transistor $N_s$ having a source which is grounded and a gate to which the precharging signal $\Phi$ is supplied through the buffer 1. In this circuit, a MOS transistor train consisting of n-channel MOS transistors $N_1$ to $N_4$ which are connected to each other in series are inserted between a drain of the p-channel MOS transistor $P_1$ and a drain of the n-channel MOS transistor Ns. Data signals $D_1$ to $D_4$ are supplied to gates $G_1$ to $G_4$ of the n-channel MOS transistors $N_1$ to $N_4$ through buffers 2 to 5, respectively. In such an arrangement, an output signal $V_{out}$ of the decoder circuit is obtained from the drain of the p-channel MOS transistor $P_1$.

Subsequently, an operation of the decoder circuit will be described. At first, the precharging signal $\Phi$ is set to a L level. At this time, the buffer 1 makes ground potential inputted to the gate of the p-channel MOS transistor $P_1$ as well as the gate of the n-channel MOS transistor $N_s$. Therefore, the p-channel MOS transistor $P_1$ brings into an on-state whereas the n-channel MOS transistor $N_2$ brings into an off-state. As a result, the output signal $V_{out}$ becomes a potential of power supply regardless of the levels of the data signals $D_1$ to $D_4$ (hereinafter this state being referred to as "a precharging state").

Subsequently, the precharging signal $\Phi$ is changed into a H level. At this time, the buffer 1 makes power potential inputted to the gate of the p-channel MOS transistor $P_1$ as well as the gate of the n-channel MOS transistor $N_s$. As a result, the p-channel MOS transistor $P_1$ is changed into the off-state whereas the n-channel MOS transistor $N_s$ is changed into the on-state. Therefore, the output signal $V_{out}$ depends on the levels of the data signals $D_1$ to $D_4$. That is, in the case where all of the data signals $D_1$ to $D_4$ are at the H level, since the buffers 2 to 5 output power potential, respectively, all of the n-channel MOS transistors $N_1$ to $N_4$ bring into the on-state, whereby the output signal $V_{out}$ outputs ground potential (hereinafter this state being referred to as "a sampling state"). On the other hand, if the levels of the data signals $D_1$ to $D_4$ are set in such a manner that $D_1$, $D_2$ and $D_3$ are at the H level and $D_4$ is at the L level, since the buffers 2 to 4 output power potential, the n-channel MOS transistors $N_1$ to $N_3$ bring into the on-state. However, the n-channel MOS transistor $N_4$ brings into the off-state because the buffer 4 outputs ground potential. Hence, the output signal $V_{out}$ holds power potential, which is the output level in the precharging state, as it is (hereinafter this state being referred to as "a holding state").

By the way, in the above-mentioned conventional decoder circuit, there exist floating capacities $C_1$ to $C_3$ and $C_L$ irrelevant to the nodes of the n-channel MOS transistors $N_1$ to $N_4$ and output signal $V_{out}$. An influence of those floating capacities $C_1$ to $C_3$ and $C_L$ on a signal outputted from the decoder when power potential fluctuates will be described below.

It is assumed that the data signals $D_1$ to $D_4$ are set such that $D_1$ to $D_3$ are at the H level but $D_4$ is at the L level. In this case, the decoder circuit is changed from the precharging state to the holding state, and its timing chart is shown in FIG. 5. In the precharging state, when power potential VDD is $V_1$, the respective gate potentials $G_1$ to $G_4$ for the n-channel MOS transistors $N_1$ to $N_4$ are so that $G_1$ to $G_3$ are $V_1$ and $G_4$ is 0. Since the p-channel MOS transistors $N_1$ to $N_4$ have a threshold value $V_{TN}$, the respective nodes A to C have a level $V_1-V_{TN}$.

Thereafter, the precharging signal is changed into the H level so that the decoder circuit comes to the holding state. At this time, because the p-channel MOS transistor $P_1$ is in the off-state, the output signal $V_{out}$ is held to $V_1$ by the floating capacity $C_L$. At this time, a charge $Q_L$ of the floating capacity $C_L$ is equal to $C_LV_1$. On the other hand, the levels of the nodes A to C are held to $V_1-V_{TN}$ because the n-channel MOS transistor $N_4$ is in the off-state. At this time, the charges $Q_1$ to $Q_3$ of the respective floating capacities $C_1$ to $C_3$ are represented as follows:

$$Q_1=C_1 (V_1-V_{TN})$$

$$Q_2=C_2 (V_1-V_{TN})$$

$$Q_3=C_3 (V_1-V_{TN})$$

Here, it is assumed that the power potential VDD is changed from $V_1$ to $V_2$ where $V2-V1 \geq V_{TN}$. Although the source of the p-channel MOS transistor $P_1$ is changed into $V_2$ in level with fluctuation of power supply, the gate thereof is also changed into $V_2$ in level by the aid of the buffer 1. The p-channel MOS transistor $P_1$ is held in the off-state against fluctuation of power supply. On the other hand, the gate potential $G_1$ to $G_3$ for the n-channel MOS transistors $N_1$ to $N_3$ are moved to $V_2$ in level by the aid of the buffers 2 and 3 likewise. At this time, because of $G_1=V_2 \geq V_{out}+V_{TN}=V_1+V_{TN}$, the node A rises up to the same level as the output signal $V_{out}$. However, because the p-channel MOS transistor $P_1$ is in the off-state, electric charges which are charged in the floating capacity $C_L$ result in transfer. That is, the charges are shared between the floating capacity $C_L$ and the floating capacities $C_1$, $C_2$ and $C_3$, as a result of which the output signal $V_{out}$ is fluctuated as follows:

$$V_{out}=V_1-\{(C_1+C_2+C_3)/(C_1+C_2+C_3+C_L)\}\cdot V_{TN}$$

Thereafter, even though power potential VDD is again returned to $V_1$, the level of the output signal $V_{out}$ is held as it is. If $C_{1+C2}+C_3=C_L$ and VTM $=V_1/2$, then the following condition is satisfied.

$$V_{out} \approx V_1-V_{TN}=V_1/2$$

This means that, if a logical threshold value for a post-stage to which the output signal $V_{out}$ of the decoder circuit is inputted is VDD/2, the level of the output signal $V_{out}$ is logically inverted intentionally. That is, when the fluctuation of power supply exceeds $V_{TN}$, the decoder circuit malfunctions.

As a first countermeasure against the above-described fluctuation of power supply, the floating capacity $C_L$, which is set so as to satisfy the condition of $C_L \geq C_1+C_2+C_3$, is inserted into the decoder circuit as shown in FIG. 4. A timing chart at this case is shown in FIG. 6. Likewise in the above-described case, the charge sharing occurs against the fluctuation of power supply in the holding state. However, if $C_L=C_1+C_2+C_3$ and $V_{TN}=V_1/2$, then the output signal $V_{out}$ can be set as follows:

$$V_{out}=V_1-V_{TN}/2=3/4\ V_1$$

Likewise in the foregoing case, if a logical threshold value for a post-stage to which the output signal $V_{out}$ of the decoder circuit is inputted is VDD/2, this makes it unnecessary to logically invert the level of the output signal $V_{out}$.

Furthermore, as a second countermeasure against the fluctuation of power supply, there is a decoder circuit shown in FIG. 7. This decoder circuit includes a p-channel MOS transistor $P_1$ having a source which is connected to a power supply VDD and a gate which inputs a precharging signal $\Phi$ through a buffer 11, and an n-channel MOS transistor $N_s$ having a source which is connected to ground potential and a gate to which the precharging signal $\Phi$ is inputted through the buffer 11. In the decoder circuit, a MOS transistor train consisting of n-channel MOS transistors $N_1$ to $N_4$ which are connected in series is inserted between the drain of the p-channel MOS transistor $P_1$ and the drain of the n-channel MOS transistor $N_s$. Data signals $D_1$ to $D_4$ are inputted to gates $G_1$ to $G_4$ of the n-channel MOS transistors $N_1$ to $N_4$ through 2-input type OR buffers 12 to 15, respectively. The precharging signal $\Phi$ is inversely inputted to one input terminal of each of the 2-input type OR buffers 12 to 15. Also, one terminals of capacities $C_{H1}$ to $C_{H4}$ are connected to the gates $G_1$ to $G_4$, respectively, whereas the other terminals of the capacities $C_{H1}$ to $C_{H4}$ are commonly connected to each other, and input a step-up signal $\Phi'$ through a buffer 16. In this decoder circuit, an output signal $V_{out}$ is obtained from the drain of the p-channel MOS transistor $P_1$.

Now, an operation of the decoder circuit thus organized will be described with reference to a timing chart shown in FIG. 8.

At first, when the precharging signal $\Phi$ is at the L level, the p-channel MOS transistor $P_1$ is in an on-state and the output signal $V_{out}$ comes to a $V_1$ level. Also, since the two-input type OR buffers 12 to 15 inversely input the precharging signal $\Phi$, they output a signal of the $V_1$ level regardless of the levels of the data signals $D_1$ to $D_4$, respectively. Nodes A to C between the respective n-channel MOS transistors $N_1$ to $N_4$ are precharged up to the levels of $V_1-V_{TN}$ likewise in the decoder circuit shown in FIG. 4. Subsequently, when the step-up signal $\Phi'$ comes to the H level, the respective potentials of the gates $G_1$ to $G_4$ rises up to the level of $2\ V_1$ due to $C_{H1}$ to $C_{H4}$. Hence, because of $G_1=2\ V_1\geq V_{out}+V_{TN}=3/2\ V_1$, the potential of the node A rises up to the same level as the output signal $V_{out}$. However, unlike the foregoing case, because the p-channel MOS transistor $P_1$ is in the on-state, the potential of the node A rises up to the level of $V_1$. Likewise, the potentials of the nodes B and C rise up to the level of $V_1$. When the step-up signal $\Phi'$ comes to the L level, the levels of the gates $G_1$ to $G_4$ are changed into $V_1$ again. However, the levels of the nodes A to C are not changed.

Then, when the precharging signal $\Phi$ comes to the H level, the p-channel MOS transistor $P_1$ is changed into the off-state, and the gates $G_1$ to $G_4$ also come to the levels of the data signals $D_1$ to $D_4$, respectively. In FIG. 8, the data signals $D_1$ to $D_3$ are set to the H level whereas the data signal $D_4$ is set to the L level, likewise in the foregoing case. Since the n-channel MOS transistor $N_4$ is in the off-state, the output signal $V_{out}$ is held to the $V_1$ level. At this time, it is assumed that the power potential VDD fluctuates from $V_1$ to $V_2$ ($V_2\geq V_1+V_{TN}$). The gates $G_1$ to $G_3$ are changed from $V_1$ to $V_2$ with fluctuation of VDD. However, the electric charges in the floating capacities $C_1$ to $C_3$ and $C_L$ is not transferred anywhere. Hence, the condition of $V_{out}=V_1$ is held with no change in level of the output signal $V_{out}$. That is, the decoder circuit does not malfunction against the fluctuation of power supply.

The conventional decoder circuit shown in FIG. 4 makes it necessary to increase the capacity $C_L$. However, for that reason, it has a drawback that the reading speed is low in the sapling state.

On the other hand, the conventional decoder circuit shown in FIG. 7 has no drawback that the reading speed is low. However, it has a drawback that a lot of additional circuits such as the 2-input OR buffers and the capacities $C_{H1}$ to $C_{H4}$ as well as the control operation using the step-up signal $\Phi'$ are required for making the potentials of the gates $G_1$ to $G_4$ rise.

SUMMARY OF THE INVENTION

The present invention has been made to eliminate the above-mentioned drawbacks with the conventional decoder circuit, and an object of the invention is to provide a decoder circuit which prevents the reading speed in the sapling state from being low and does not require complicated timing control and a lot of additional circuits.

The above object has been achieved by provision of a decoder circuit, which comprises: a first MOS transistor having a source which is connected to a first power supply and a gate to which a precharging signal is inputted; a second MOS transistor having a source which is connected to a second power supply and a gate to which the precharging signal is inputted, the first MOS transistor being of a type different from that of the second MOS transistor; a first MOS transistor train connected between the drains of the first and second MOS transistors, the first MOS transistor train consisting of a plurality of MOS transistors which are of the same type as the second MOS transistor and connected in series, and the gates of the plurality of MOS transistors to which data signals are inputted, respectively; a third MOS transistor of the same type as the second MOS transistor connected between the drain of the first MOS transistor and the first MOS transistor train; a fourth MOS transistor of the same type as the first MOS transistor, the fourth MOS transistor having a source which is connected to the first power supply, a gate to which the precharging signal is inputted and a drain which is connected to a gate of the third MOS transistor; and a capacity connected between the drain of the fourth MOS transistor and the second power supply, to thereby obtain an output signal from a drain of the first MOS transistor.

The above and other objects and features of the present invention will be more apparent from the following description taken in conjunction with the accompanying drawings.

DETAILED DESCRIPTION OF THE PREFERRED EMBODIMENTS

Now, description will be given of an embodiment in accordance with the present invention with reference to the accompanying drawings.

Figure 1:
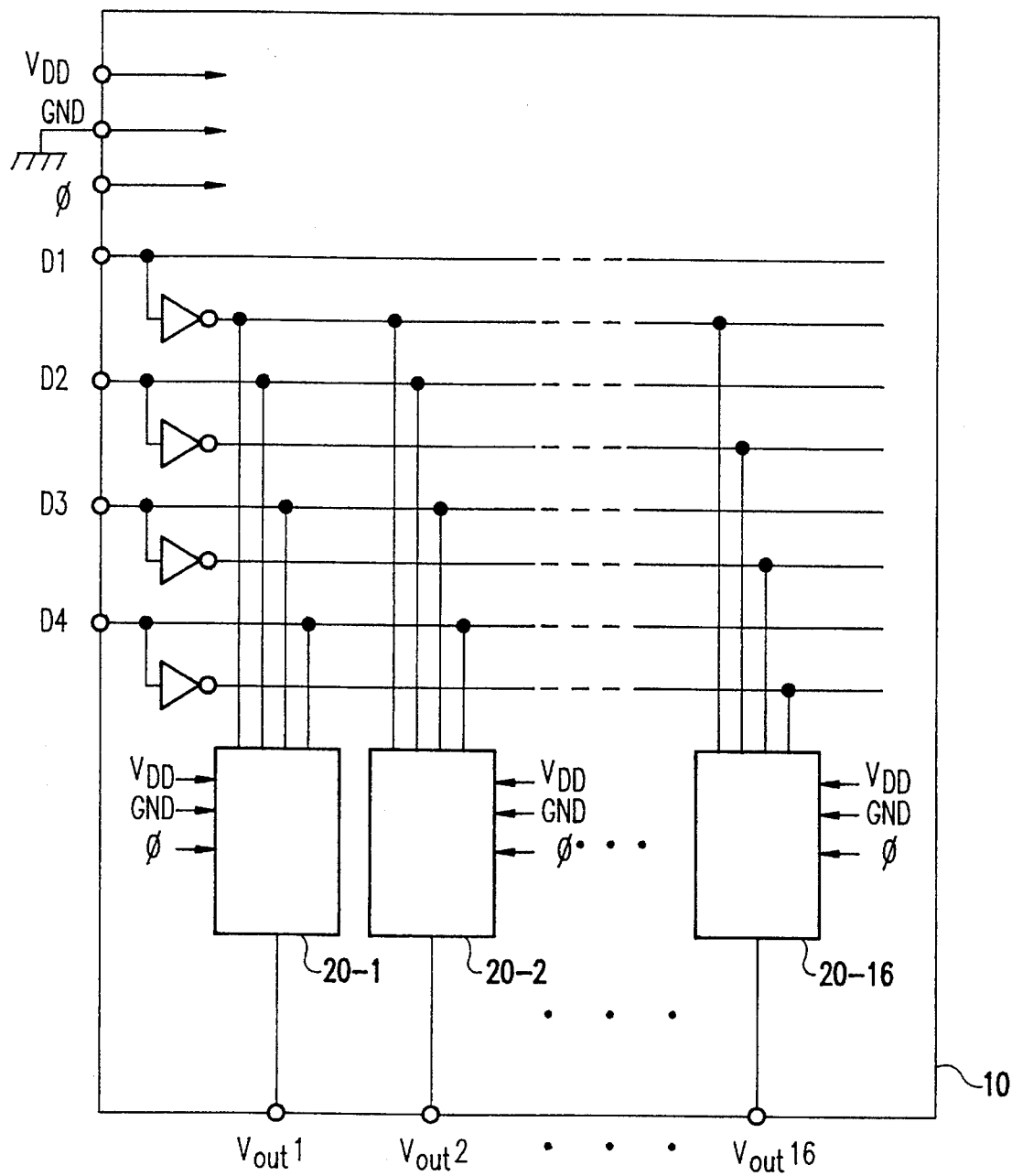
FIG. 1 is a general diagram showing a decoder circuit in accordance with one embodiment of the present invention.

FIG. 1 is a general diagram showing a decoder circuit in accordance with one embodiment of the present invention. In FIG. 1, the decoder circuit is arranged so as to decode input data signals $D_1$ to $D_4$ in the form of 4 bits to generate output signals $V_{out}1$ to $V_{out}16$. The respective data signals $D_1$ to $D_4$ are used to generate true and complementary signals which are inputted to dynamic circuits 20-1 to 20-16 having different combination of the signals inputted thereto, respectively, as shown in FIG. 1. Since all of the dynamic circuits 20-1 to 20-16 are formed by the same circuit arrangement, for simplification of the description, one dynamic circuit 20-1 among the circuits 20-1 to 20-16 is shown in FIG. 2 as one example in detail.

Figure 2:
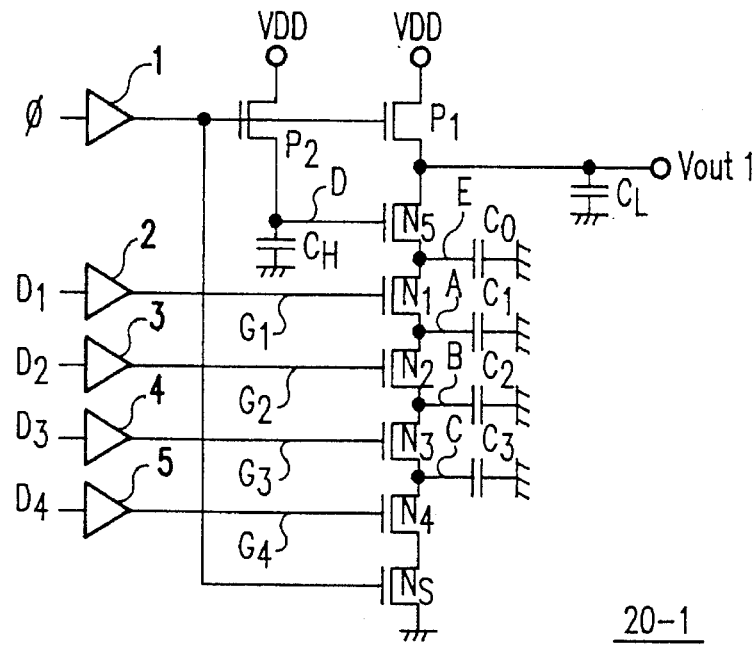
FIG. 2 is a diagram showing a dynamic circuit used in the decoder circuit according to the embodiment of the invention.
Figure 3:
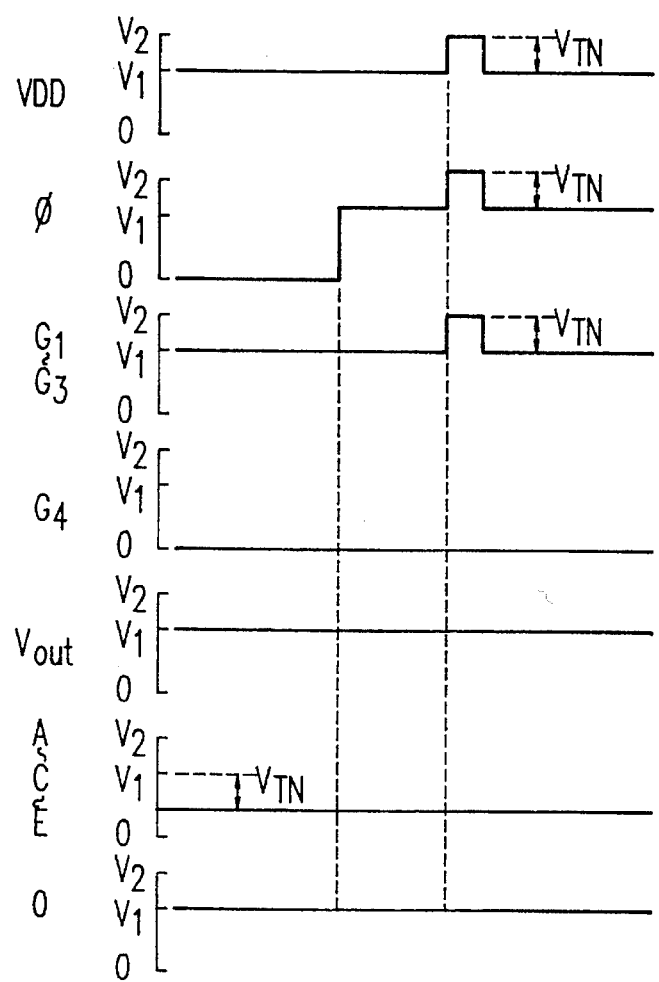
FIG. 3 is a timing chart representing the operation of the decoder circuit shown in FIG. 2.
Figure 4:
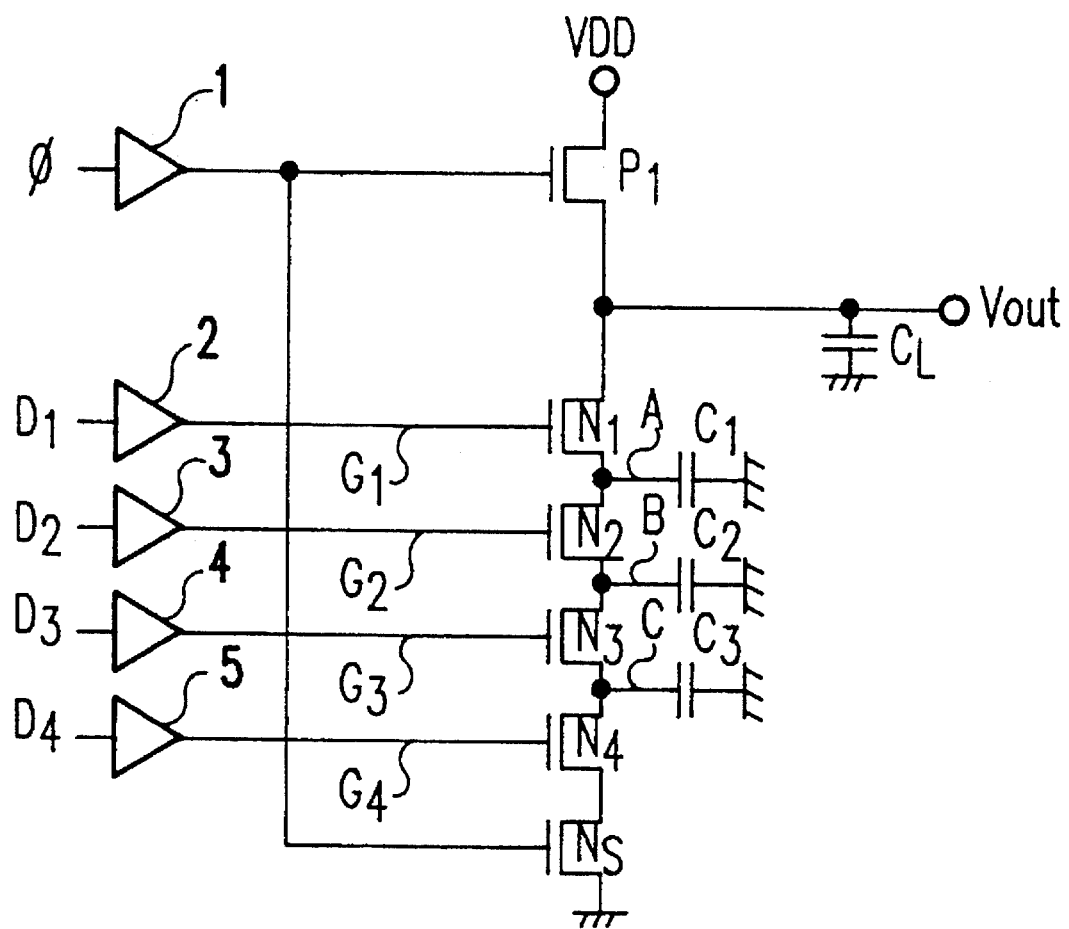
FIG. 4 is a diagram showing one example of a conventional decoder circuit.
Figure 5:
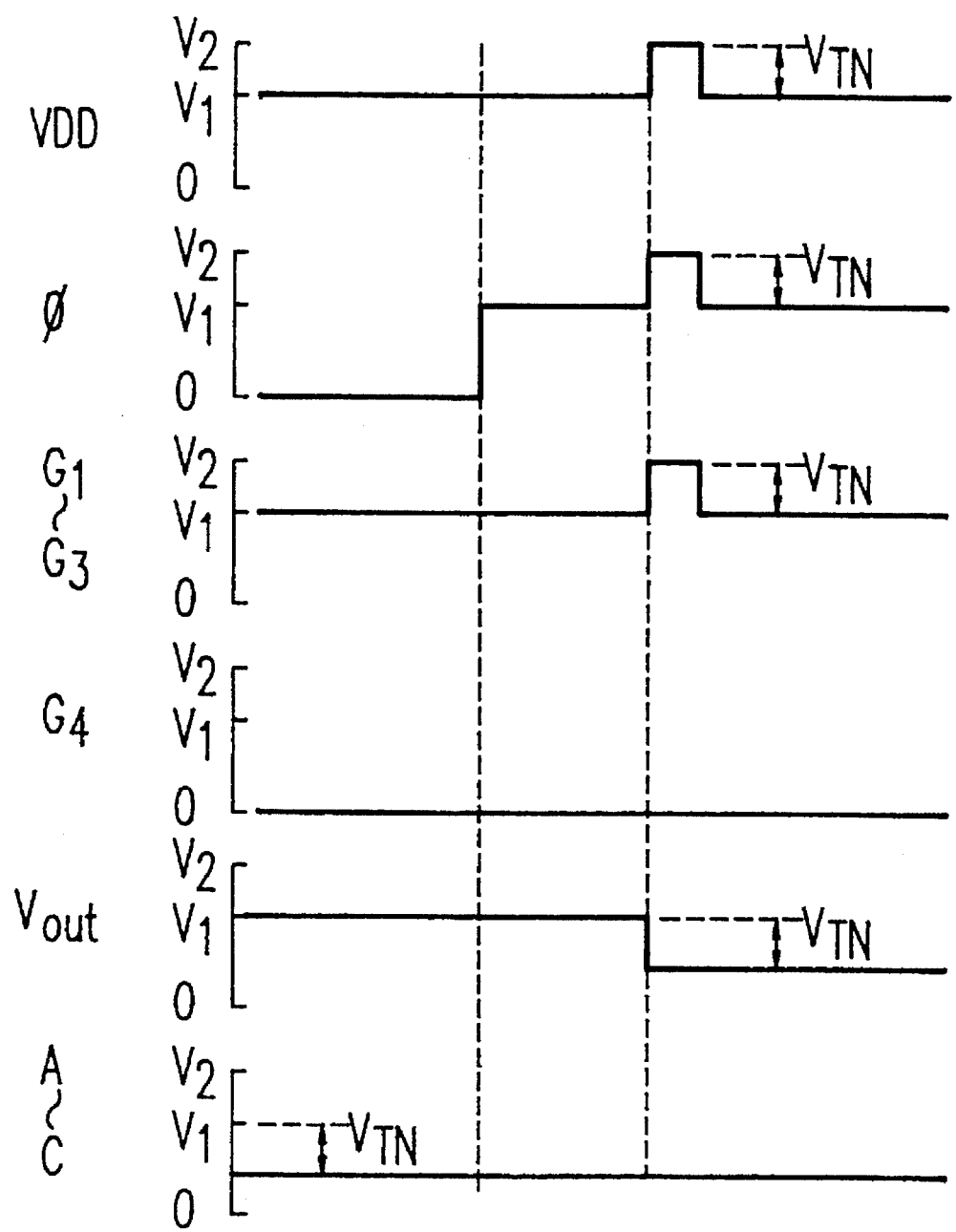
FIG. 5 is a first timing chart representing the operation of the decoder circuit shown in FIG. 4.
Figure 6:
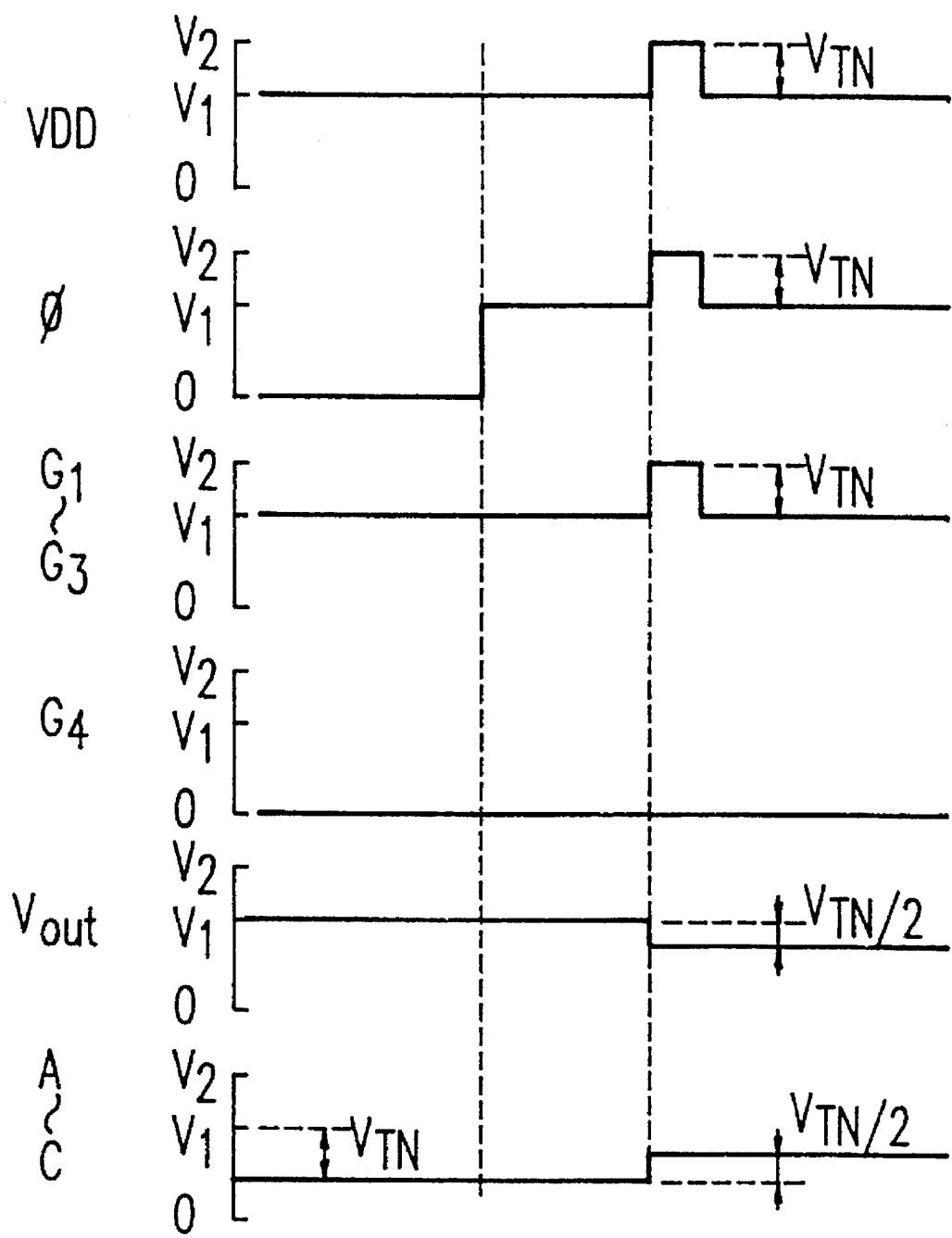
FIG. 6 is a second timing chart representing the decoder circuit shown in FIG. 4.
Figure 7:
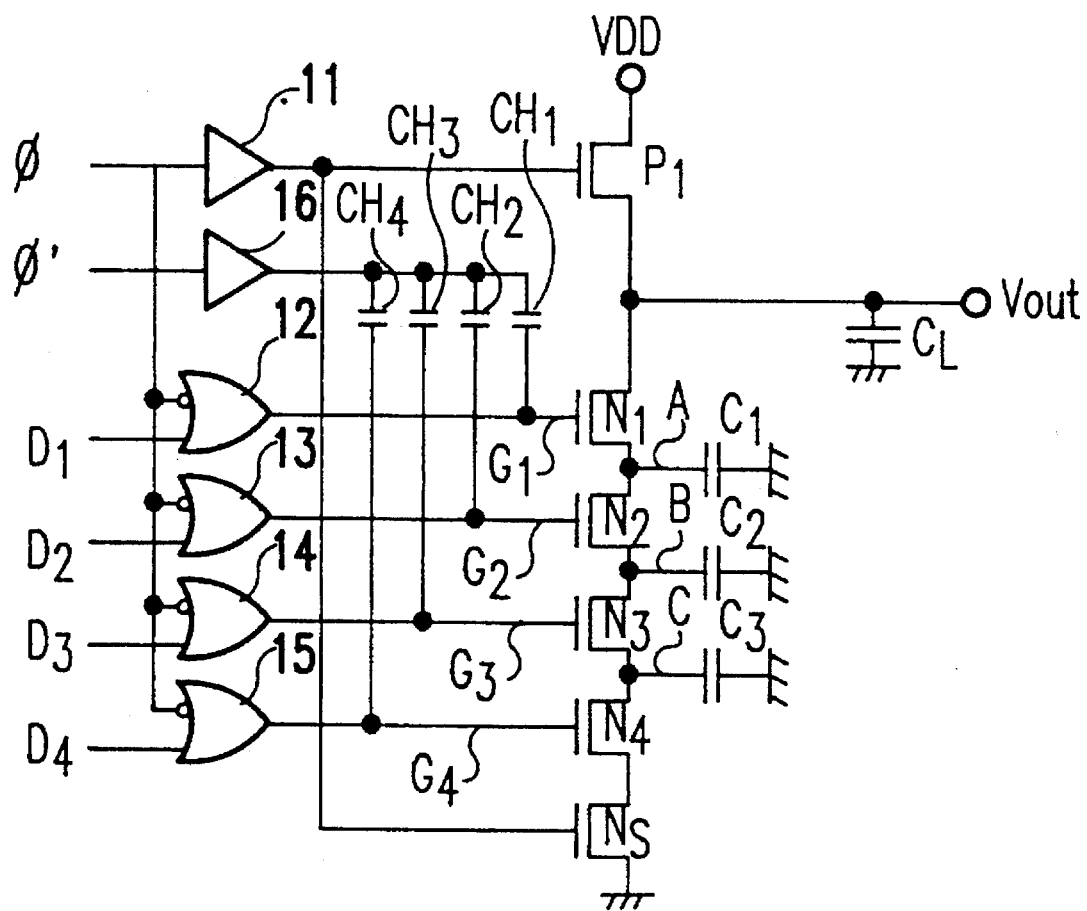
FIG. 7 is a diagram showing another example of the conventional decoder circuit.
Figure 8:
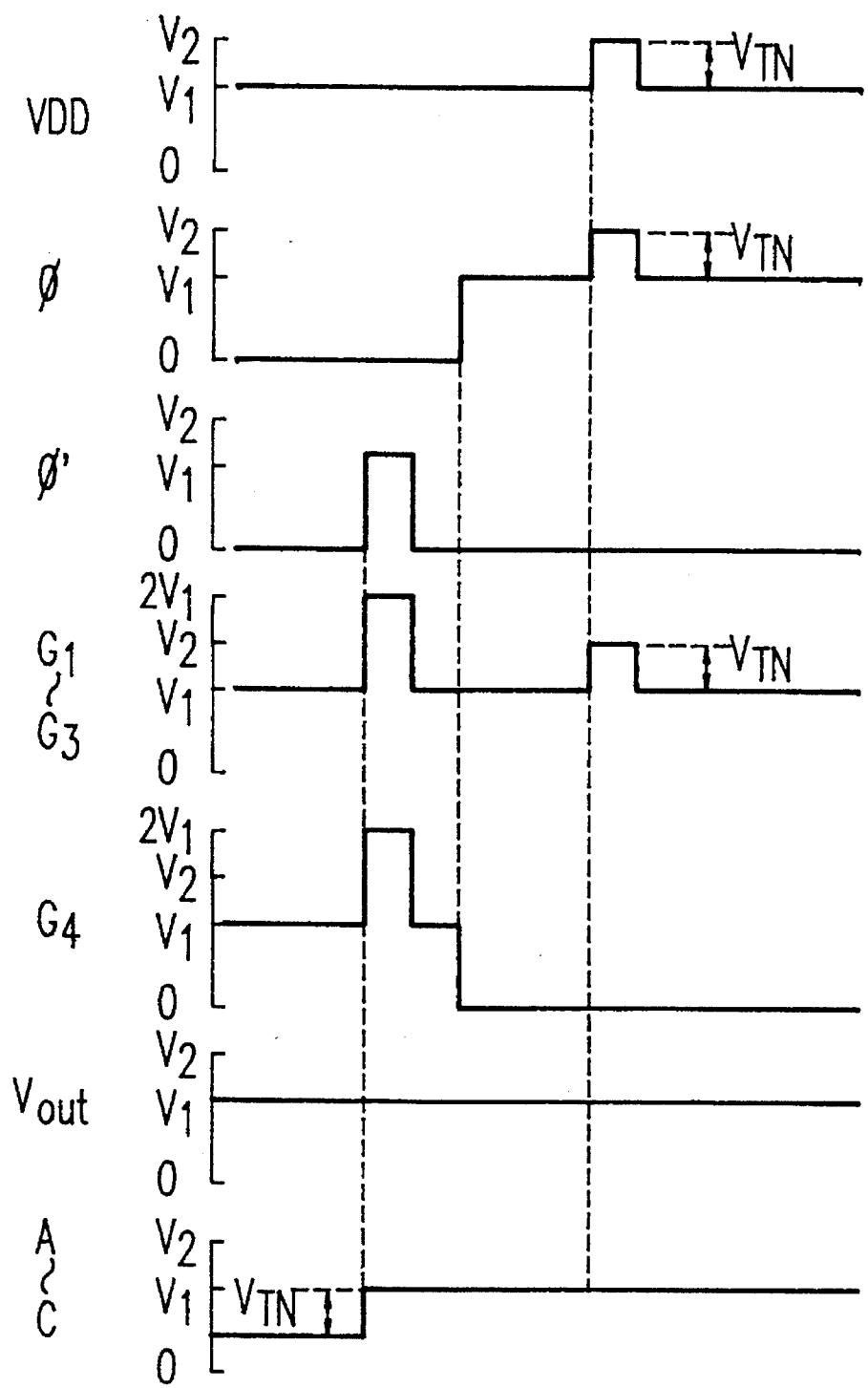
FIG. 8 is a timing chart representing the operation of the decoder circuit shown in FIG. 7.

The dynamic circuit 20-1 shown in FIG. 2 includes a p-channel MOS transistor $P_1$ having a source which is connected to a power supply VDD and a gate which inputs a precharging signal $\Phi$ through a buffer 1, and an n-channel MOS transistor $N_s$ having a source which is connected to the ground potential and a gate which inputs the precharging signal $\Phi$ through the buffer 1. In the dynamic circuit, a MOS transistor train consisting of n-channel MOS transistors $N_1$ to $N_4$ which are connected in series is inserted between the drain of the p-channel MOS transistor $P_1$ and the drain of the n-channel MOS transistor $N_s$. Input data signals $D_1$ to $D_4$ are inputted to gates $G_1$ to $G_4$ of the n-channel MOS transistors $N_1$ to $N_4$ through buffers 2 to 5, respectively. Further, an n-channel MOS transistor $N_5$ is inserted between the drain of the n-channel MOS transistor $N_1$ and the p-channel MOS transistor $P_1$. Moreover, the source of a p-channel MOS transistor $P_2$ is connected to the power supply VDD, and the gate of the p-channel MOS transistor $P_2$ receives the precharging signal $\Phi$ through the buffer 1. The drain of the p-channel MOS transistor $P_2$ is connected to the gate of the n-channel MOS transistor $N_5$ and also to the ground potential through a capacity $C_H$. In the dynamic circuit, an output signal $V_{out}1$ is obtained from the drain of the p-channel MOS transistor $P_1$.

Now, an operation of the dynamic circuit 20-1 shown in FIG. 2 will be described. At first, when the precharging signal $\Phi$ is at the ground level indicative of L level, both of the p-channel MOS transistors $P_1$ and $P_2$ are in an on-state and an output signal $V_{out}1$ from the respective drains of those transistors $P_1$ and $P_2$ as well as an node D therebetween has a power potential VDD which is equal to $V_1$. At this time, the capacity $C_H$ is charged with electric charges of $Q_H=C_H V_1$. On the other hand, if the levels of the input data signals $D_1$ to $D_4$ are set such that $D_1$, $D_2$ and $D_3$ are at the H level, but $D_4$ is at the L level, since the buffers 2 to 4 output power potential $VDD=V_1$, respectively, the potentials of the gates $G_1$ to $G_3$ are equal to $V_1$.

If a threshold value of the n-channel MOS transistors is $V_{TN}(=1/2\ V_1)$, then the potential at a node E between the n-channel MOS transistors $N_5$ and $N_1$ satisfies the condition of $E=V_1-V_{TN}$. Similarly, the nodes A to C between the n-channel MOS transistors $N_1$ to $N_3$ satisfy the condition of $A=B=C=V_1-V_{TN}$. At this time, the floating capacities $C_0$ to $C_3$ connected to the respective nodes are charged with the following electric charges.

$Q_0=C_0\ (V_1-V_{TN})$ $Q_1=C_1\ (V_1-V_{TN})$ $Q_2=C_2\ (V_1-V_{TN})$ $Q_3=C_3\ (V_1-V_{TN})$

Subsequently, when the precharging signal $\Phi$ comes to the power voltage VDD indicative of level, then the p-channel MOS transistor $P_1$ and $P_2$ are changed into the off-state. At this time, the node D is held to $V_1$ by the capacity $C_H$. On the other hand, the n-channel MOS transistor $N_s$ changes into the on-state, however, since the n-channel MOS transistor $N_4$ is in the off-state, the nodes E and A to C are held to the level of $V_1-V_{TN}$, respectively, but $V_{out}1$ is held to the level of V1.

In this state, it is assumed that the power potential VDD is changed from $V_1\ V_2\ (V_2 \geq V_1+V_{TN})$.

At this time, because the output signal of the buffer 1 also fluctuates from $V_1$ to $V_2$ simultaneously, both of the p-channel MOS transistors $P_1$ and $P_2$ are held in the off-state. Hence, the level $V_1$ of the node D is held as it is. Accordingly, because of $D=V_1<V_{out}+V_{TN}=V_1+V_{TN}$, the node E is also held to the level of $V_1-V_{TN}$. The node $G_1$ fluctuates to $V_2$ due to the buffer 2. However, since both of the nodes E and A have the level of $V_1-V_{TN}$, electric charges are not transferred anywhere so that the node A comes to $V_1-V_{TN}$. Therefore, because the output signal $V_{out}$ is held to the level of $V_1$, the dynamic circuit does not malfunction against the fluctuation of power supply.

As was described above, the present invention can realize a decoder circuit which does not require to add a capacity to an output terminal of the decoder circuit, does not share electric charges against the fluctuation of power supply only by adding two MOS transistors and one capacity, and does not malfunction.

As a result, the reading speed in the sampling state is prevented from being low, and a complicated timing control and a lot of additional circuits are not required, thereby being capable of providing a decoder circuit with ease and high performance.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A transistor circuit, comprising:

an output terminal;

a first MOS transistor having a source connected to a first power supply, a gate receiving a precharging signal, and drain connected to said output terminal;

a second MOS transistor having a source connected to a second power supply and a gate receiving said precharging signal, said first MOS transistor being of a type different from that of said second MOS transistor;

a plurality of third MOS transistors of the same type as said second MOS transistor connected in series connected between a drain of said second MOS transistor and a circuit node, said third MOS transistors receiving at gates thereof data signals, respectively;

a fourth MOS transistor of the same type as said second MOS transistor connected between said output terminal and said circuit node; and a fifth MOS transistor of the same type as said first MOS transistor having a source connected to said first power supply, a gate receiving said precharging signal and a drain connected to a gate of said fourth MOS transistor.

2. The transistor circuit as claimed in claim 1, further comprising a capacitor connected between the gate of said fourth MOS transistor and said second power supply.

3. A decoder circuit comprising an output node, first precharging means for precharging said output node to a first potential in response to a precharging signal, a transistor circuit having first and second nodes and at least one first transistor coupled between said first and second nodes and receiving at a gate thereof an input signal, a second transistor inserted between said output node and said first node of said transistor circuit, and second precharging means for precharging a gate of said second transistor to said first potential in response to said precharging signal.

4. The decoder circuit as claimed in claim 3, further comprising discharging means for discharging said second node of said transistor circuit to a second potential when said precharging signal disappears.

5. The decoder circuit as claimed in claim 4, wherein said first precharging means includes a third transistor connected between a first power supply line supplying said first potential and said output node and having a gate supplied with said precharging signal, said discharging means including a fourth transistor connected between a second power supply line supplying said second potential and said second node and having a gate supplied with said precharging signal, said second precharging means including a fifth transistor connected between said first power supply line and said gate of said second transistor and having a gate supplied with said precharging signal, said third and fifth transistor are of a first channel type, and said fourth transistor is of a second channel type.

* * * * *